US006358763B1

(12) United States Patent
Wells et al.

(10) Patent No.: US 6,358,763 B1
(45) Date of Patent: Mar. 19, 2002

(54) METHODS OF FORMING A MASK PATTERN AND METHODS OF FORMING A FIELD EMITTER TIP MASK

(75) Inventors: David H. Wells; Aaron R. Wilson; John J. Michiels, all of Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/545,978

(22) Filed: Apr. 10, 2000

Related U.S. Application Data (63) Continuation of application No. 09/251,176, filed on Feb. 17, 1999, now Pat. No. 6,143,580.

(51) Int. Cl.$^7$ ............................................... H01L 21/00
(52) U.S. Cl. ....................... 438/20; 427/180; 427/184; 427/194; 427/77; 427/355; 427/359; 216/11
(58) Field of Search ............................ 427/64, 77, 184, 427/194, 96, 355–358, 359, 71; 216/11; 438/20

(56) References Cited

U.S. PATENT DOCUMENTS

| | | | |
|---|---|---|---|
| 1,311,491 A | | 7/1919 | Briggs ......................... 427/194 |
| 1,505,908 A | | 8/1924 | Mac Kinnon ................ 427/277 |
| 3,650,809 A | | 3/1972 | Gilliam et al. ................. 117/75 |
| 3,731,146 A | | 5/1973 | Bettiga et al. .................. 317/3 |
| 3,754,984 A | | 8/1973 | Payne ......................... 117/152 |
| 3,791,856 A | | 2/1974 | Duling et al. ................ 117/155 |
| 3,877,962 A | * | 4/1975 | Taylor et al. ................ 427/375 |
| 4,050,786 A | * | 9/1977 | Feldman ...................... 350/160 |
| 4,173,494 A | | 11/1979 | Johnson et al. ................ 136/89 |
| 4,407,695 A | * | 10/1983 | Deckman et al. ............ 156/643 |
| 4,494,479 A | | 1/1985 | Drury et al. ................. 118/120 |
| 4,602,590 A | | 7/1986 | Hass, Sr. et al. .............. 118/13 |
| 4,711,835 A | | 12/1987 | Dufour ........................ 430/314 |
| 5,148,765 A | | 9/1992 | Hung et al. .................. 118/100 |
| 5,220,725 A | * | 6/1993 | Chan et al. .................... 29/874 |
| 5,221,981 A | * | 6/1993 | Kodera et al. ................. 359/76 |
| 5,484,314 A | * | 1/1996 | Farnworth .................... 445/24 |

(List continued on next page.)

OTHER PUBLICATIONS

J. I. Biegeleisen, *The Complete Book of Silk Screening Printing Production*, New York: Dover Publications, Inc., Chapter 2, pp. 14–19 and Chapter 16, pp. 169–175, 1963.

*Primary Examiner*—Charles Bowers
*Assistant Examiner*—Erik Kielin
(74) *Attorney, Agent, or Firm*—Wells, St. John, Roberts, Gregory & Matkin

(57) ABSTRACT

Methods of forming mask patterns and methods of forming field emitter tip masks are described. In one embodiment a first surface is provided over which a mask pattern is to be formed. A mixture comprising mask particles is applied to a second surface comprising material joined with the first layer. The mixture, as applied, leaves an undesirable distribution of mask particles over the first surface. After application of the mixture to the second surface, the mask particles are laterally distributed over the first surface, into a desirable distribution by placing a particle-dispersing structure directly into the mixture on the second surface and moving the particle-dispersing structure laterally through the mixture on the second surface. In another embodiment, a mixture is formed on the substrate's second surface and includes a liquid component and a plurality of solid mask-forming components. A mixture-thinning structure is positioned over the substrate and separated from the second surface thereof only by the mixture. The mixture-thinning structure is moved through the mixture in a manner which forms at least some of the mask-forming components into a monolayer of single mask components over the second surface.

20 Claims, 6 Drawing Sheets

(1 of 6 Drawing Sheet(s) Filed in Color)

U.S. PATENT DOCUMENTS

| | | | |
|---|---|---|---|
| 5,504,385 A | * 4/1996 | Jin et al. | 313/310 |
| 5,527,586 A | 6/1996 | Schuler et al. | 428/164 |
| 5,587,623 A | * 12/1996 | Jones | 313/497 |
| 5,676,853 A | 10/1997 | Alwan | 216/11 |
| 5,695,658 A | * 12/1997 | Alwan | 216/42 |
| 5,804,145 A | 9/1998 | Gao et al. | 422/101 |
| 5,811,020 A | 9/1998 | Alwan | 216/42 |
| 5,916,641 A | 6/1999 | McArdle et al. | 427/487 |

* cited by examiner

METHODS OF FORMING A MASK PATTERN AND METHODS OF FORMING A FIELD EMITTER TIP MASK

RELATED PATENT DATA

This patent is a continuation application of U.S. patent application Ser. No. 09/251,176, which was filed on Feb. 17, 1999, entitled "Methods of Forming a Mask Pattern and Methods of Forming a Field Emitter Tip Mask," naming David H. Wells, Aaron R. Wilson and John J. Michiels as inventors, and which is now U.S. Pat. No. 6,143,580, the disclosure of which is incorporated by reference.

PATENT RIGHTS STATEMENT

This invention was made with Government support under Contract No. DABT63-97-C-0001 awarded by Advanced Research Projects Agency (ARPA). The Government has certain rights in this invention.

TECHNICAL FIELD

The present invention relates generally to methods of forming mask patterns. More particularly, it concerns methods of forming field emitter tip masks.

BACKGROUND OF THE INVENTION

Microelectronic devices are typically fabricated, in part, by forming features on selected layers of a semiconductor wafer. The individual features are often formed by patterning a mask to protect selected portions of an underlying layer of material during subsequent processing steps. Various methods of the present invention can be used to fabricate virtually any type of microelectronic device, but such methods are particularly useful for fabricating field emission displays ("FEDs") in use, or proposed for use in computers, television sets, camcorder view finders, and a variety of other applications.

FEDs are one type of flat panel display in which a baseplate with a generally planar emitter substrate is juxtaposed to a face plate with a substantially transparent display screen. The baseplate has a number of emitters formed on the emitter substrate that project from the emitter substrate towards the face plate. The emitters are typically configured into discrete emitter sets in which the bases of the emitters in each emitter set are commonly connected. The baseplate also has an insulator layer formed on the emitter substrate and an extraction grid formed on the insulator layer. A number of holes are formed through the insulator layer and extraction grid, in alignment with the emitters to open the emitters to the face plate. In operation, a voltage differential is established between the extraction grid and the emitters to extract electrons from the emitters.

The display screen of the face plate is typically coated with a substantially transparent conductive material to form an anode, and the anode is coated with a cathodoluminescent layer. The anode draws the electrons extracted from the emitters through the extraction grid and across a vacuum gap between the extraction grid and the cathodoluminescent layer of material. As electrons strike the cathodoluminescent layer, light emits from the impact site and travels through the anode and the glass panel of the display screen. The emitted light from each of the areas becomes all or part of a picture element. Exemplary structures and methods of forming such structures are described in U.S. Pat. Nos. 5,676,853 and 5,695,658, the disclosures of which are incorporated by reference herein.

One objective of FEDs is to produce a desired brightness of light in response to the emitted electrons. The brightness at each picture element depends, in part, upon the density of emitters in the emitter sets corresponding to each picture element. In general, it is desirable to have a constant emitter density from one emitter set to another, and also from one area in an individual emitter set to another. Thus, it is desirable to space the emitters apart from one another by a substantially uniform distance and to make the emitters substantially the same size and shape.

One method for forming emitters is to randomly distribute a number of beads on a hard oxide layer that has been deposited over the emitter substrate. The beads may be distributed across the surface of the oxide layer by depositing a solution in which the beads are suspended onto the oxide layer, and spinning the substrate to spread the solution thereover. Subsequently, liquid is evaporated or removed from the solution to leave the beads on the oxide layer. This generally leaves the beads with a density that goes inversely proportional to the square of the radial distance from the spinning axis. Accordingly, spin coating does not give a uniform density. The beads may also be distributed across the surface of the oxide layer by a dry dispensing method in which a dry mixture of beads is propelled toward the oxide layer in a jet of air or inert gas. The mixture is then allowed to settle on the oxide layer to form a mask of randomly-distributed particles on the surface of the oxide. The oxide layer is then selectively etched relative to the mask to form a random distribution of island-like oxide areas under the beads. After the beads are removed from the oxide layer, the emitters are formed under the island-like areas of oxide by etching, in some cases isotropically, the substrate.

Problems in the past with the above-described methods relate to variations in emitter sizes and shapes. Specifically, the desired diameter of the base of each emitter is generally the diameter of a single, isolated bead. However, in various application methods, the beads often agglomerate into clusters that remain intact as they are distributed across the surface of the substrate. The agglomerated clusters can include beads that are clumped together in a plane over the substrate and/or beads that are stacked into more than one level over the substrate. It will be appreciated that clusters of beads produce larger, irregular-shaped islands of oxide which result in larger, irregular-shaped emitters. As a result, the emitters produced by this emitter patterning method may not have a uniform size and shape.

Another problem associated with various emitter patterning techniques is that the emitters may not be uniformly spaced apart from one another. Specifically, since the beads are distributed randomly across the surface of the oxide layer, it is difficult to control the spacing between the beads. Thus, the space between the emitters produced by this emitter patterning method can vary significantly from one area to another on the display.

Accordingly, this invention arose out of concerns associated with providing improved methods of forming mask patterns. Specifically, this invention arose out of concerns associated with providing improved methods of forming field emitter tip masks.

SUMMARY OF THE INVENTION

Methods of forming mask patterns and methods of forming field emitter tip masks are described. In one embodiment a first surface is provided over which a mask pattern is to be formed. A mixture comprising mask particles is applied to a second surface comprising material joined with the first layer. The mixture, as applied, leaves an undesirable distribution of mask particles over the first surface. After application of the mixture to the second surface, the mask particles are laterally distributed over the first surface and into a desirable distribution over the first surface by placing a particle-dispersing structure directly into the mixture on the second surface and moving the particle-dispersing structure laterally through the mixture on the second surface. In another embodiment, a mixture is formed on the substrate's second surface and includes a liquid component and a plurality of solid mask-forming components. A mixture-thinning structure is positioned over the substrate and separated from the second surface thereof only by the mixture. The mixture-thinning structure is moved through the mixture in a manner which forms at least some of the mask-forming components into a monolayer of single mask components over the second surface.

BRIEF DESCRIPTION OF THE DRAWINGS

The file of this patent contains at least one drawing executed in color. Copies of this patent with color drawings will be provided by the Patent and Trademark Office upon request and payment of the necessary fee.

Preferred embodiments of the invention are described below with reference to the following accompanying drawings.

FIG. 11 is an enlarged view of a portion of FIG. 10.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
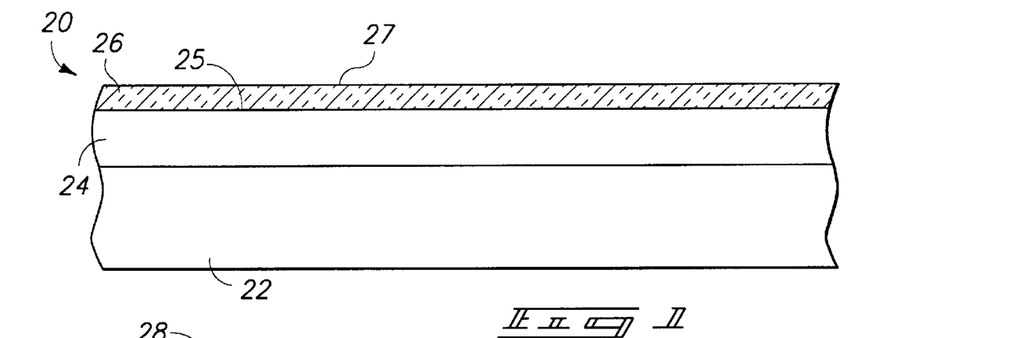
FIG. 1 is a diagrammatic side sectional view of a substrate in accordance with one embodiment of the invention.

Referring to FIG. 1, a substrate is shown generally at 20 and preferably comprises a baseplate for a field emission display ("FED"). Although subsequent processing is described in the context of processing of a baseplate of an FED, it will be appreciated that the present invention is not limited to FEDs and can be used in many other semiconductor processing applications.

Substrate 20, which preferably comprises a semiconductor substrate, typically includes a base layer 22, an amorphous silicon layer 24 covering base layer 22, and an oxide layer 26 covering silicon layer 24. Layer 24 comprises a first surface 25, and layer 26 comprises a second surface 27 comprising material which is joined with first surface 25. Base layer 22 can comprise a suitable semiconductive material such as silicon, or can be made from another material such as glass and covered with a suitable conductive material such as metal.

Figure 2:
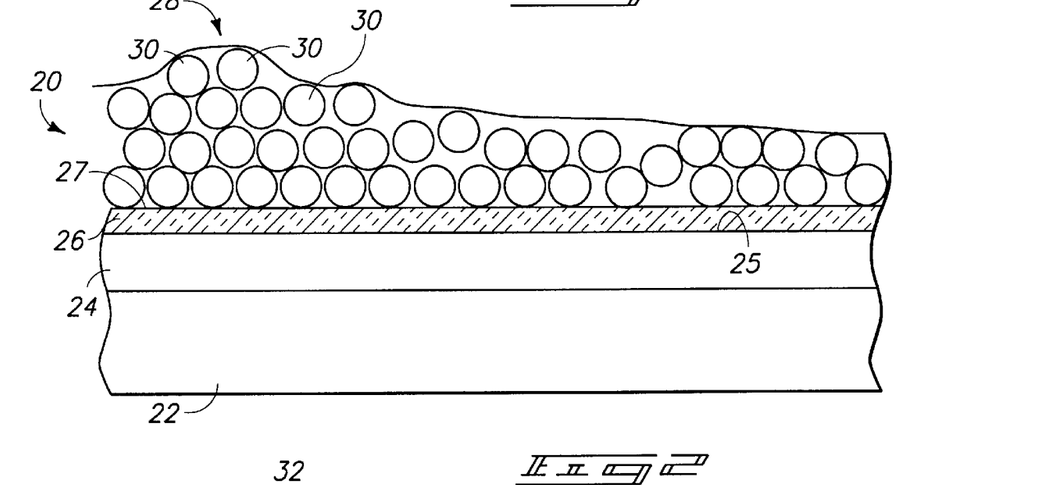
FIG. 2 is a view of the FIG. 1 substrate at a processing step which is subsequent to that which is shown in FIG. 1.

Referring to FIG. 2, a mixture 28 comprising mask particles 30 is applied to second surface 27. Mixture 28, as applied, leaves an undesirable distribution of mask particles 30 over first surface 25. In this example, the undesirable distribution of mask particles is characterized by a plurality of individual mask particles 30 which are clustered together to form a collection of mask particles which are stacked upon one another. In addition, it may be undesirable to have the mask particles distributed so closely together as to not leave any spacing therebetween.

Figure 3:
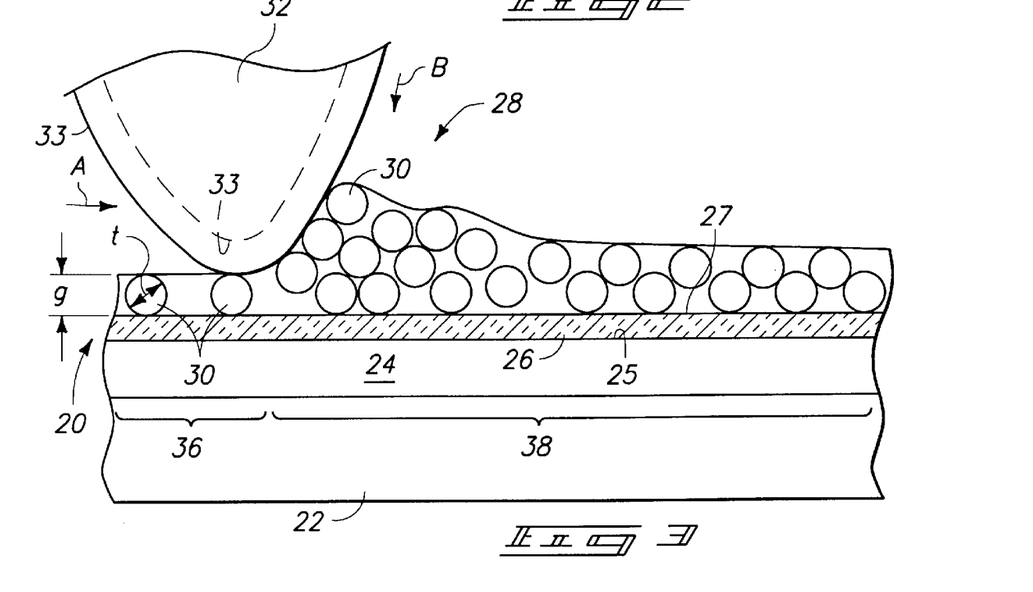
FIG. 3 is a view of the FIG. 1 substrate at a processing step which is subsequent to that which is shown in FIG. 2.
Figure 4:
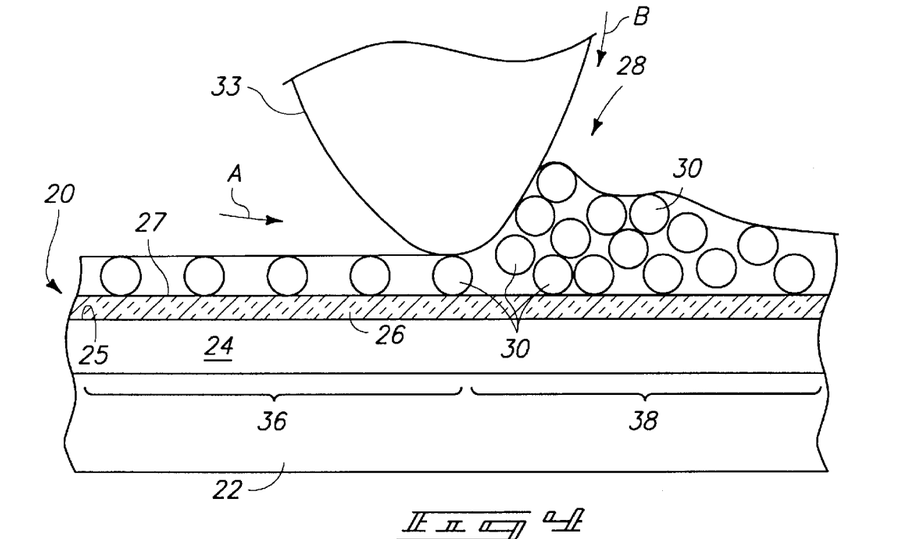
FIG. 4 is a view of the FIG. 1 substrate at a processing step which is subsequent to that which is shown in FIG. 3.
Figure 5:
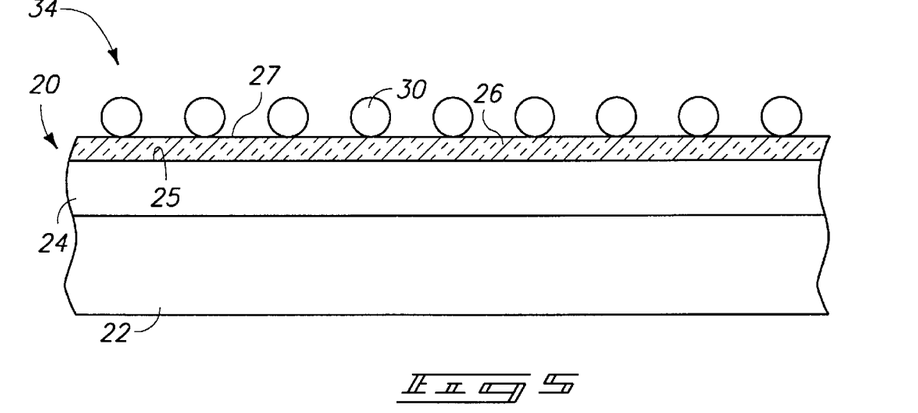
FIG. 5 is a view of the FIG. 1 substrate at a processing step which is subsequent to that which is shown in FIG. 4.

Referring to FIGS. 3–5, and in accordance with one embodiment of the invention, after mixture 28 is applied to second surface 27, individual mask particles 30 are laterally dispersed over the substrate and into a desirable distribution over first surface 25. In one preferred embodiment, dispersal of mask particles 30 takes place by placing a particle-dispersing structure 32 directly into mixture 28 on second surface 27, and moving particle-dispersing structure 32 laterally through mixture 28 on second surface 27 in the direction of arrow A (FIGS. 3 and 4). In one embodiment, as particle-dispersing structure 32 is moved through the mixture, it physically touches at least one of mask particles 30 while the particle is on second surface 27. In the illustrated example of FIG. 3, an individual mask particle 30 is shown generally under particle-dispersing structure 32 and engaged thereby. Preferably, when particle-dispersing structure 32 is moved laterally through mixture 28, individual mask particles 30 are physically touched with the structure and trapped against second surface 27 while at least a portion of particle-dispersing structure 32 is moved over the trapped mask particle 30. In this way, individual mask particles provide a stand-off for the particle-dispersing structure 32. In a preferred embodiment, effective downward pressure is applied to particle-dispersing structure 32, in the direction of arrow B (FIGS. 3 and 4), effective to disperse mask particles 30 into a monolayer of single mask particles distributed over second surface 27. An exemplary monolayer of single mask particles is shown generally at 34 in FIG. 5.

In another embodiment, individual mask particles are dispersed into the illustrated monolayer 34 by maintaining particle-dispersing structure 32 at an effective distance over second surface 27 such that as structure 32 is moved through the mixture, the individual mask particles are dispersed into the illustrated monolayer 34. In the illustrated example, the distance at which particle-dispersing structure 32 is maintained is effective that at least one, and preferably a plurality of individual mask particles 30 can be physically touched or engaged with structure 32, while the mask particles are on second surface 27.

Alternately considered, placement of the particle-dispersing structure 32 into mixture 28 defines first and second mixture regions 36, 38 respectively (FIG. 3). The mixture regions are preferably different from one another, with the illustrated first mixture region 36 being generally defined by a monolayer of single mask particles 30 distributed over second surface 27. Second mixture region 38 is generally defined by an agglomeration or collection of mask particles 30 proximate particle-dispersing structure 32. Moving particle-dispersing structure 32 laterally through mixture 28 effectively moves second region 38 across second surface 27, as shown in FIG. 4, in a manner which transfers individual mask particles from the second mixture region 38 to the first mixture region 36.

Referring to FIGS. 1–5, and 12, and in accordance with another embodiment, mixture 28 comprises a liquid mixture having a plurality of particles 30 suspended therein. In this example, liquid mixture 28 has a visually-discernible property which can be utilized to ascertain whether particles 30 have been desirably distributed over the substrate. Specifically, particle-dispersing structure 32 is provided and moved through liquid mixture 28 over surface 27 in a manner which redistributes some of the particles 30 over the surface. After particle-dispersing structure 32 is moved through liquid mixture 28, the liquid mixture is inspected for the visually-discernible property which gives an indication of a desired density of particles 30 over the surface. For example, and as perhaps shown best in FIGS. 5 and 12, individual particles 30 are formed into a monolayer 34. When particles 30 are formed into a monolayer having a desired distribution or density, the monolayer has a particular color which can be visually discerned by inspecting the liquid mixture. For example, and with respect to FIG. 12, a photograph of a substrate is shown at a magnification factor of five. A monolayer has been formed over the substrate as described above. In the photograph, a series of light and dark stripes can be seen. The dark stripes indicate areas where desired distribution or uniformity of particles exists. The lighter stripes constitute areas where undesired uniformity or distribution exists. Accordingly, through inspection of the substrate for the preferred color, one can ascertain whether a desired distribution of mask particles has been formed.

In the above-described embodiments, the particle-dispersing structure 32 preferably comprises a blade, such as a squeegee-like blade. In a preferred embodiment, the blade is flexible. Exemplary materials for the blade include polyurethane and silicone blades available from Terra Universal of Anaheim, Calif. Of course, other particle-dispersing structures can be utilized without departing form the spirit and scope of the present invention.

Referring to FIGS. 1–5, and in accordance with another embodiment of the present invention, substrate 20 is provided and comprises a surface 25 over which a field emitter tip mask is to be formed. A mixture 28 is formed on second surface 27 and has a liquid component and a plurality of solid mask-forming components 30. An exemplary liquid component is a 1:2:5 mixture of [de-ionized water:Isopropyl Alcohol:photoresist]. The photoresist can comprise Olin HPR504. Other techniques can be used. For example, the liquid component can comprise only de-ionized water. A mixture-thinning structure 32 is positioned over substrate 20 and separated from second surface 27 only by mixture 28 (FIG. 3). The mixture-thinning structure preferably thins out the mixture as described below. By thinning out the mixture, the mixture-thinning structure causes the mask-forming components to be placed into a desired orientation on the substrate. Such desired orientation can include a monolayer of single mask-forming components, a desired spacing between individual mask-forming components, and a monolayer of single mask components having a desire spacing therebetween, to name just a few. In this example, mixture-thinning structure 32 is moved (FIG. 4) through mixture 28 in a manner which forms at least some of the mask-forming components 30 into a monolayer 34 (FIG. 5) of single mask components over second surface 27. In one embodiment, movement of the mixture-thinning structure causes individual mask-forming components 30 to be physically engaged therewith. In another embodiment, mask-forming components 30, when physically engaged with mixture-thinning structure 32 are also trapped against second substrate surface 27 as the mixture-thinning structure 32 is moved thereover.

Alternately considered, and with reference to FIG. 3 and 4, mixture-thinning structure 32 comprises an outer surface 33. Mixture-thinning structure 32 is positioned at a generally fixed distance over second substrate surface 27. As mixture-thinning structure 32 is moved through mixture 28, individual mask-forming components 30 are collected proximate one portion of outer surface 33. Such is illustrated in FIGS. 3 and 4 by individual mask-forming components which are collected against or proximate the right side of surface 33. As mixture-thinning structure 32 is moved through the mixture, individual mask-forming components are caused to be moved relative to the portion of outer surface 33 against which they were formerly collected, and into monolayer 34.

In one embodiment, the mask-forming components 30 comprise a plurality of objects having generally curved outer surfaces. In another embodiment, the mask-forming components comprise a plurality of masking beads. Exemplary beads comprise surfactant-free sulfate white polystyrene latex beads ranging in diameter from between about 0.20 to 3.0 micron, and available from Interfacial Dynamics Corp., Portland, Oreg. under the product number 1-1600.

Referring to FIGS. 3 and 4, and in accordance with another embodiment of the present invention, a plurality of masking beads 30 are provided over second substrate surface 27. The masking beads are organized into a monolayer of single masking beads over second surface 27 by defining a gap g (FIG. 3) between an overlying surface 33 and second surface 27. Gap g has a spacing distance. The second substrate surface 27 is traversed with gap g while generally maintaining the spacing distance of the gap. Doing so, in one embodiment, causes the overlying surface 33 to directly engage at least some of beads 30 when the beads are disposed within gap g. In a preferred embodiment, overlying surface 33 is generally non-planar. In another embodiment, gap g is defined between a closest portion of surface 33 and second substrate surface 27. In the illustrated example, the individual masking beads 30 have an average greatest thickness dimension t (see the leftmost bead 30 in FIG. 3). The spacing distance of gap g is preferably no less than the average greatest thickness dimension t. In another embodiment, the spacing distance of gap g is less than twice the average greatest thickness dimension t. In another embodiment, the spacing distance of the gap is no less than the average greatest thickness dimension, and less than twice the average greatest thickness dimension. An exemplary range through which surface 33 can be moved to define a preferred gap lies between the illustrated dashed line 33 and the solid line designated 33 in FIG. 3.

Figure 6:
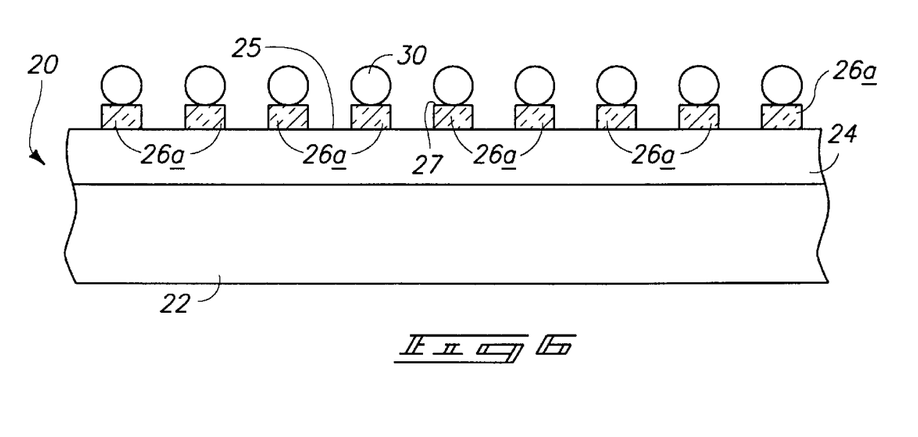
FIG. 6 is a view of the FIG. 1 substrate at a processing step which is subsequent to that which is shown in FIG. 5.
Figure 7:
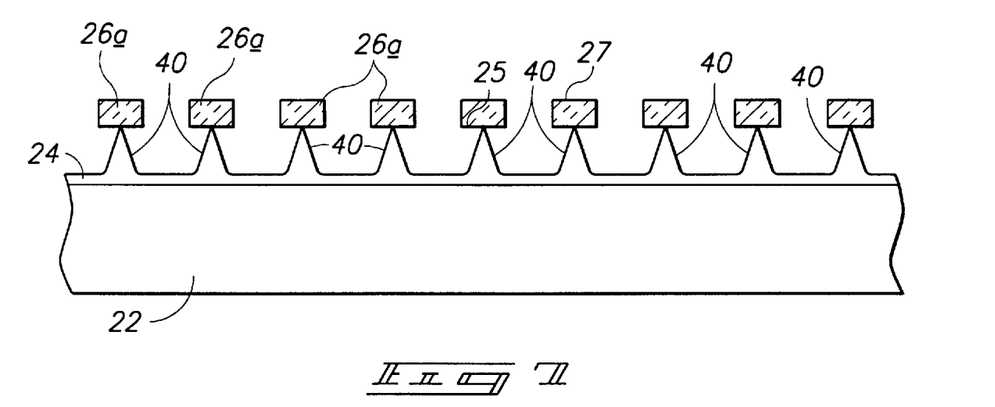
FIG. 7 is a view of the FIG. 1 substrate at a processing step which is subsequent to that which is shown in FIG. 6.
Figure 8:
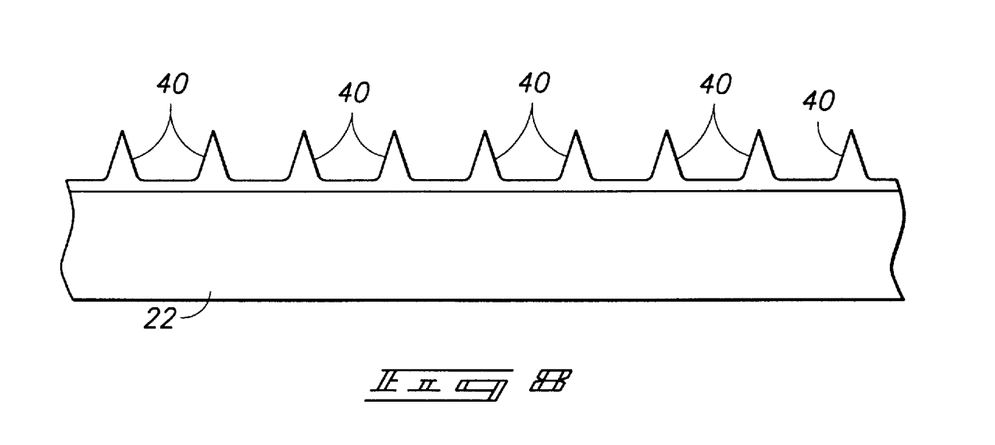
FIG. 8 is a view of the FIG. 1 substrate at a processing step which is subsequent to that which is shown in FIG. 7.

Referring to FIGS. 6–8, additional steps for forming a mask pattern and individual emitter tips are shown. Referring specifically to FIG. 6, an anisotropic etch is conducted in which unprotected portions of layer 26 are removed to form island-like mask elements 26a on surface 25.

Referring to FIG. 7, individual mask particles 30 are removed from over substrate by any suitable process. After removal of mask particles 30, individual emitter tips 40 are formed from material of layer 24 beneath mask elements 26a. It will be appreciated that the silicon layer 24 can be a layer of any other suitable material depending upon the type of features that are to be formed under mask elements 26a.

FED emitters are one typical type of feature formed under mask elements 26a. FIG. 8 illustrates a number of generally conical emitters 40 formed from portions of the silicon layer 24 beneath mask elements 26a. To form emitters 40, the silicon layer 24 is isotropically etched in an etching process known in the art. Mask elements 26a are then removed from over tips 40. When mask elements 26a are made from an oxide, a wet etchant made from a buffered hydrofluoric solution can be used to remove mask elements 26a. It will be appreciated that other features may be formed under the mask elements 26a, and thus the invention is not limited to fabricating emitters for FEDs.

Figure 9:
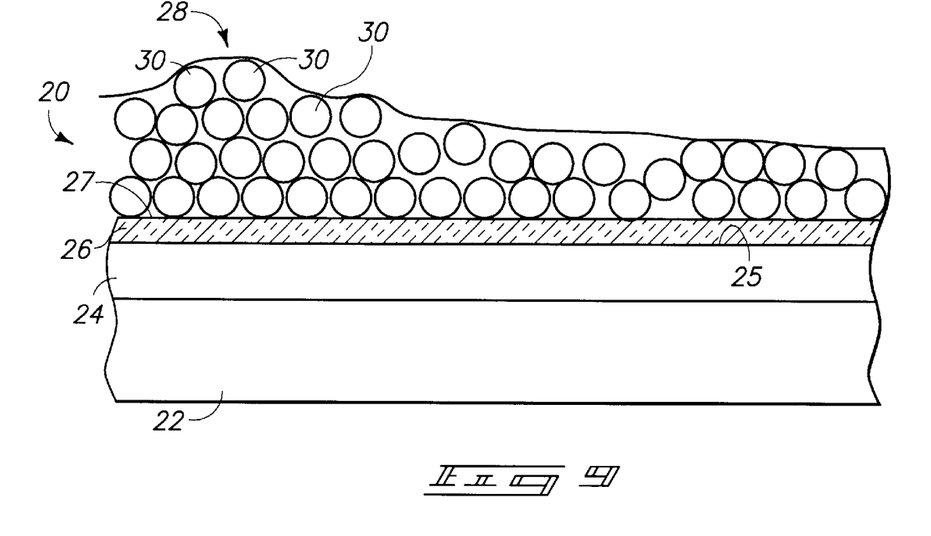
FIG. 9 is a view of a substrate in accordance with another embodiment of the present invention.
Figure 10:
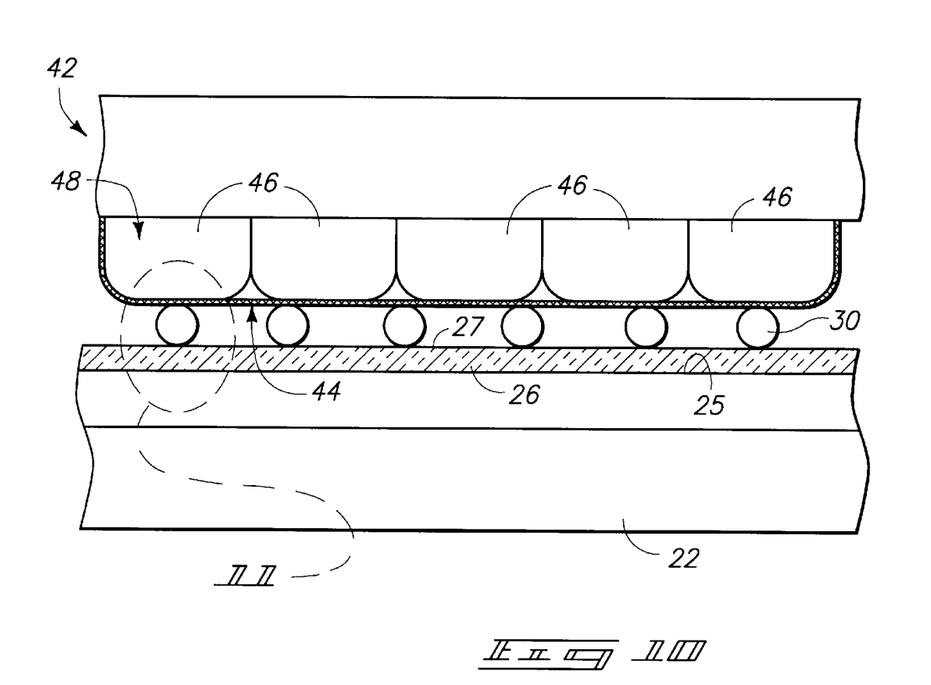
FIG. 10 is a view of the FIG. 9 substrate at a processing step which is subsequent to that which is shown in FIG. 9.
Figure 12:
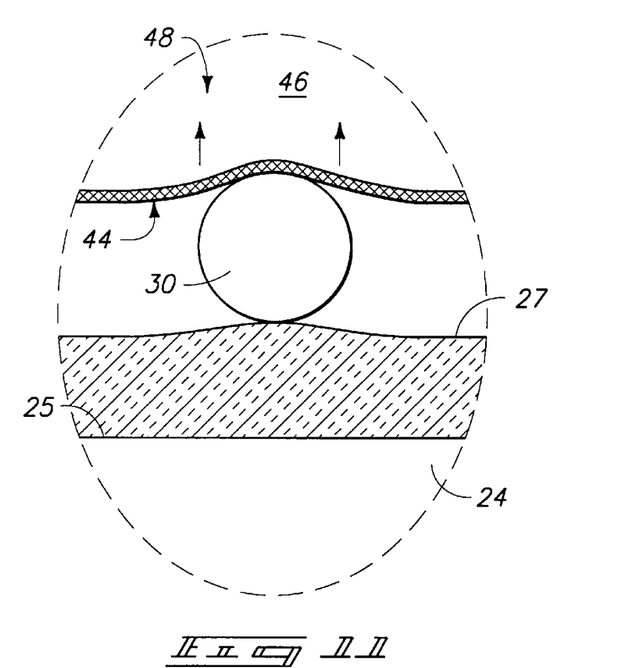
FIG. 12 is a photograph which shows a substrate illustrating certain aspects of the present invention.

Referring to FIGS. 9–11, and in an alternate embodiment, a mixture 28 is formed over substrate 20 as described above with respect to FIG. 2. A tool 42 (FIG. 10) is provided having a yieldable surface 44 and a reboundable material 46 proximate yieldable surface 44. Yieldable surface 44 and reboundable material 46 collectively provide a resilient body 48. An exemplary and preferred yieldable surface 44 comprises polyester shim stock or polycarbonate shim stock available from ARTUS Corporation of Englewood, N.J. Resilient body 48 is moved through mixture 28 in a manner which redistributes some of mask particles 30 over second substrate surface 27. As so moved, yieldable surface 44 generally follows the profile or contour of second surface 27. Specifically, second surface 27, in some instances, may not be generally planar, as is shown in FIG. 11. In these instances, having yieldable surface 44 allows for accommodations to be made which, in some instances, can maintain a generally uniform force across the surface of the substrate. This can result in a more uniform distribution of mask particles 30 thereover which, in turn, increases the uniformity of the ultimately-formed field emitter tips.

In one embodiment, reboundable material 46 comprises a contained volume of material which is disposed behind yieldable surface 44 to provide the rebounding characteristic. In another embodiment, a plurality of discrete contained volumes of material are provided behind yieldable surface 44. Such is shown in FIG. 10 wherein a plurality of individual compartmentalized contained volumes 46 are provided. In another embodiment, reboundable material 46 comprises an air pocket which is disposed behind yieldable surface 44. In a preferred embodiment, reboundable material 46 comprises a plurality of discrete air pockets behind the yieldable surface.

Figure 13:
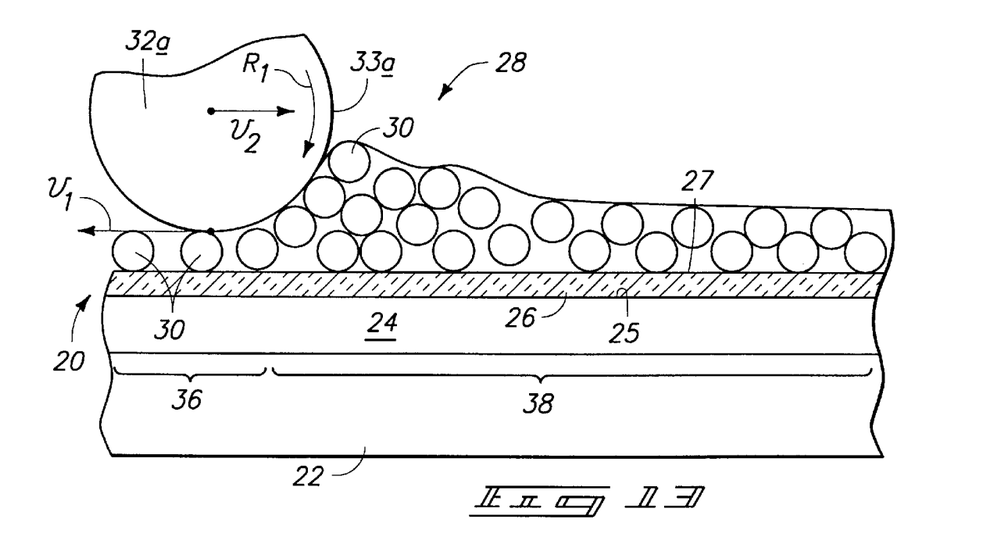
FIG. 13 is a view of the FIG. 1 substrate at a processing step in accordance with another embodiment of the invention.

Referring to FIG. 13, and in alternate embodiment, a mixture 28 is formed on second surface 27 as described above with respect to FIG. 2. The mixture comprises a liquid component and a plurality of mask-particles 30. A particle-dispersing structure 32a is provided having an outer surface 33a. Like numerals from the FIG. 2 embodiment are utilized where appropriate, with differences being indicated by the suffix "a" or with different numerals. Particle-dispersing structure outer surface 33a is placed into mixture 28 and moved relative to the substrate at a first velocity $v_1$. In the illustrated and a preferred embodiment, the moving of outer surface 33a comprises rotating the outer surface. In the illustrated example, rotation takes place in the direction of arrow $R_1$, and the first velocity comprises the tangential velocity of the outer surface relative to and generally parallel with the substrate. Rotation could, of course, take place in the opposite direction. During at least some of the time that the outer surface is moved, the particle-dispersing structure 32a is moved through mixture 28 at a second velocity $v_2$ which is different from the first velocity. In this example, the vectors which coincide with the first and second velocities are generally opposite one another. These velocities could, of course, have vectors which extend in the same direction.

Advantages of various above-described embodiments include provision of a monolayer of mask particles over a surface in a manner which enhances the uniformity with which the particles are distributed over the surface. Additionally, improvements are attained insofar as processing complexity is concerned. That is, other methods such as meniscus or extrusion coating are more time consuming and more complicated than the present inventive methods. Other advantages will be apparent to those of skill in the art.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming a field emitter tip mask comprising:
   providing a substrate having a first surface over which the field emitter tip mask is to be formed;
   forming a mask element layer over the first surface, the mask element layer defining a second surface disposed over the first surface;
   providing a tool having a yieldable surface and a reboundable material proximate the yieldable surface, the yieldable surface and reboundable material collectively providing a resilient body;
   forming a mixture having mask particles suspended therein over the second surface, the mixture having a first distribution of mask particles; and
   forming a second distribution of mask particles over the second surface by laterally moving the resilient body through the mixture in a manner that generally follows the profile of the second surface.

2. The method of claim 1, wherein the moving of the resilient body redistributes a majority of the mask particles into a monolayer of single mask particles over the second surface defined by the mask element layer.

3. The method of claim 1, wherein the providing of the tool having the yieldable surface and the reboundable material comprises providing a contained volume of material behind the yieldable surface to provide the reboundable material.

4. The method of claim 1, wherein the providing of the tool having the yieldable surface and the reboundable material comprises providing a plurality of discrete contained volumes of material behind the yieldable surface to provide the reboundable material.

5. The method of claim 1, wherein the providing of the tool having the yieldable surface and the reboundable material comprises providing an air pocket behind the yieldable surface to provide the reboundable material.

6. The method of claim 1, wherein the providing of the tool having the yieldable surface and the reboundable material comprises providing a plurality of discrete air pockets behind the yieldable surface to provide the reboundable material.

7. A method of forming a field emitter tip mask comprising:

provided a substrate having a first surface over which the field emitter tip mask is to be formed;

forming a mask element layer over the first surface, the mask element layer defining a second surface disposed over the first surface;

forming a mixture on the second surface, the mixture comprising a liquid component and a plurality of mask-particles;

providing a particle-dispersing structure having an outer surface;

placing the particle-dispersing structure into the mixture and moving the structure such that the outer surface moves relative to the substrate at a first velocity; and moving the particle-dispersing structure through the mixture at a second velocity which is different from the first velocity.

8. The method of claim 7, wherein moving the structure such that the outer surface moves relative to the substrate at a first velocity comprises rotating the outer surface.

9. The method of claim 8, wherein the first velocity comprises the tangential velocity of the rotating outer surface relative to and generally parallel with the substrate.

10. The method of claim 7, wherein the first and second velocities have respective vectors which extend in opposite directions.

11. The method of claim 7, wherein the first and second velocities have respective vectors which extend in the same direction.

12. The method of claim 1, wherein forming the mixture having a first distribution of mask particles over the second surface comprises forming the mixture having a first discernable visual property.

13. The method of claim 12 wherein forming the second distribution of mask particles over the second surface comprises changing the first visually discernable property to a second visually discernable property discernable from the first visually discernable property.

14. The method of claim 13 wherein the first visually discernable property and the second visually discernable property are colors.

15. The method of claim 7 wherein forming the mixture on the second surface comprises forming a mixture having a first distribution of particles.

16. The method of claim 15, wherein forming the mixture having a first distribution of particles comprises forming the mixture having a first optically discernable property.

17. The method of claim 16 wherein forming the mixture having a first optically discernable property comprises forming the mixture having a first color.

18. The method of claim 7 wherein moving the particle-dispersing structure through the mixture comprises changing the first distribution of particles to a second distribution of particles.

19. The method of claim 18 wherein changing the first distribution of particles to a second distribution of particles comprises changing a first optically discernable property to a second optically discernable property.

20. The method of claim 9 wherein changing a first optically discernable property to a second optically discernable property comprises changing a first color to a second color.

* * * * *

UNITED STATES PATENT AND TRADEMARK OFFICE
CERTIFICATE OF CORRECTION

PATENT NO.   : 6,358,763 B1
DATED        : March 19, 2002
INVENTOR(S)  : David H. Wells et al.

It is certified that error appears in the above-identified patent and that said Letters Patent is hereby corrected as shown below:

<u>Column 10,</u>
Line 28, replace "The method of claim 9" with -- The method of claim 19 --

Signed and Sealed this

Twenty-second Day of October, 2002

Attest:

Attesting Officer

JAMES E. ROGAN
*Director of the United States Patent and Trademark Office*